United States Patent [19]

Spohrer

[11] Patent Number: 5,148,047
[45] Date of Patent: Sep. 15, 1992

[54] CMOS BUS DRIVER CIRCUIT WITH IMPROVED SPEED

[75] Inventor: Thomas S. Spohrer, Austin, Tex.

[73] Assignee: Motorola, Inc., Schaumburg, Ill.

[21] Appl. No.: 835,114

[22] Filed: Feb. 14, 1992

Related U.S. Application Data

[63] Continuation of Ser. No. 536,375, Jun. 11, 1990, abandoned.

[51] Int. Cl.[5] .................. H03K 17/56; H03K 3/26
[52] U.S. Cl. ............................. 307/246; 307/270; 307/263; 307/585
[58] Field of Search ............ 307/585, 475, 480, 481, 307/443, 451, 571, 530, 270, 246, 263

[56] References Cited

U.S. PATENT DOCUMENTS

| | | | |
|---|---|---|---|
| 4,593,212 | 6/1986 | Svager | 307/443 |
| 4,621,202 | 11/1986 | Pumo | 307/241 |
| 4,692,638 | 9/1987 | Siegler | 307/449 |
| 4,763,023 | 8/1988 | Spence | 307/480 |
| 4,769,559 | 9/1988 | Mahabadi | 307/585 |
| 4,794,280 | 12/1988 | Van Tran | 307/570 |
| 4,877,980 | 10/1989 | Kubinec | 307/542 |
| 4,883,989 | 11/1989 | Mizukami | 307/448 |
| 4,914,316 | 4/1990 | Rossi et al. | 307/571 |
| 4,933,574 | 6/1990 | Lien et al. | 307/570 |
| 4,942,398 | 7/1990 | Peterson | 307/443 |
| 4,977,337 | 12/1990 | Ohbayashi | 307/570 |
| 5,001,731 | 3/1991 | Atwell et al. | 307/480 |
| 5,070,256 | 12/1991 | Grondalski | 307/571 |

Primary Examiner—Stanley D. Miller
Assistant Examiner—Toan Tran
Attorney, Agent, or Firm—Paul J. Polansky

[57] ABSTRACT

A CMOS bus driver circuit with improved speed attributable to reduced capacitive loading on a control signal line and reduced capacitance added to the capacitance of a bus line. In one form, the bus driver circuit comprises a P-channel transistor and two N-channel transistors. The P-channel transistor has its current conducting path connected between a data line signal and a control electrode of the first N-channel transistor, and receives a control signal on its control electrode. A first N-channel transistor has its current conducting path connected between the bus line and a power supply voltage terminal. A second N-channel transistor has its current path connected between the gate of the first N-channel transistor and the power supply voltage terminal, and receives the control signal on its control electrode. The driver circuit improves speed by reducing capacitance on input signal lines and the bus line, eliminates a charge sharing problem, and eliminates a need to use an extra level of logic to provide a control signal.

8 Claims, 2 Drawing Sheets

CMOS BUS DRIVER CIRCUIT WITH IMPROVED SPEED

This application is a continuation of prior application Ser. No. 07/536,375, filed Jun. 11, 1990, now abandoned.

CROSS-REFERENCE TO RELATED, COPENDING APPLICATION

Related copending application of particular interest to this invention is application Ser. No. 07/486,443, filed Feb. 28, 1990, on behalf of Lloyd P. Mathews entitled "Data Processor Circuit and Method for Controlling Voltage Variation of a Dynamic Node".

FIELD OF THE INVENTION

This invention relates generally to communication bus driver circuits, and more particularly, to CMOS bus driver circuits for use in a data processor.

BACKGROUND OF THE INVENTION

An integrated circuit often uses a communication bus to route groups of signals between different parts of the integrated circuit. The bus comprises several signal lines made of a low-impedance conductor, typically metal, and couples to a plurality of circuits for either receiving signals therefrom or providing signals thereto. Buses are used in microprocessor integrated circuits to internally route address and data signals between blocks. For example, in response to an instruction, a microprocessor data register couples its contents onto a data bus and the data is received from the bus by an arithmetic logic unit.

In order to optimize the speed of the integrated circuit, it is generally necessary to preset or precharge the voltage level on the bus prior to the data transfer. Typically, each bus line is precharged to a logic high. Then when the data is transferred, each driver circuit connected to a bus line either maintains the precharged level of the bus line if the logic level to be provided is a logic high, or discharges the bus line if the logic level to be provided is a logic low. Therefore, the time it takes to discharge the bus line determines the speed. Furthermore, a control signal must be provided to enable a corresponding driver circuit so that the driver circuit can provide the voltage level on the bus line only at desired times.

The nature of a precharged bus creates limitations in the speed in which the driver circuit provides its data bit to a bus line. Because a bus routes groups of signals to different blocks which may be located on different sides of the integrated circuit, each bus line is relatively long and therefore may be modeled as a transmission line with a large distributed capacitance. In order for the driver circuit to discharge the bus quickly, the transistors in the driver circuit must also be large. However, the capacitance which the transistors add to the bus lines to which they are connected, and the capacitance which the transistors add to the data and control signals received on their gates, are both proportional to transistor size. Thus, for a particular driver circuit, the improvement in speed due to an increase in transistor size to discharge the bus faster, eventually equals the decrease in speed due to the increased capacitance added to the bus line and to the data and control signals. Therefore, no further improvement in speed is provided.

SUMMARY OF THE INVENTION

Accordingly, there is provided, in one form, a bus driver circuit comprising first, second, and third transistors. The first transistor has a first current electrode coupled to a data signal, a control electrode for receiving a control signal, and a second current electrode. The second transistor has a first current electrode coupled to the second current electrode of the first transistor, a control electrode for receiving the control signal, and a second current electrode coupled to a power supply voltage terminal. The third transistor has a first current electrode coupled to a bus line, a control electrode coupled to the second current electrode of the first transistor, and a second current electrode coupled to the power supply voltage terminal.

These and other objects, features and advantages will be more clearly understood from the following detailed description taken in conjunction with the accompanying drawings.

DETAILED DESCRIPTION OF THE INVENTION

Figure 1:
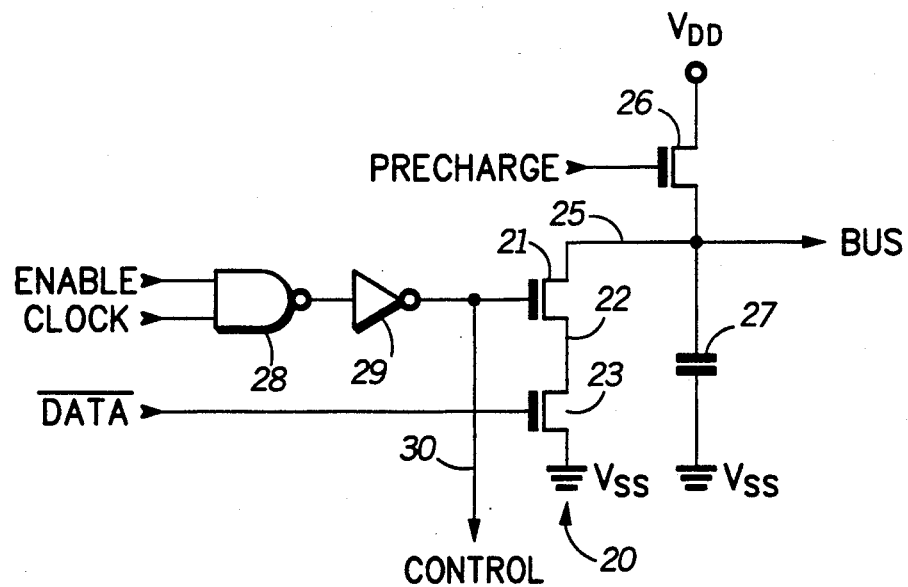
FIG. 1 illustrates in partial schematic form a known bus driver circuit.

FIG. 1 illustrates in partial schematic form a known bus driver circuit 20 connected to a bus line 25. Also shown in FIG. 1 are an N-channel transistor 26, a capacitor 27, a NAND gate 28, and an inverter 29. Circuit 20 comprises an N-channel transistor 21 having a drain connected to bus line 25, a gate connected to a node 30, and a source connected to a node 22; and an N-channel transistor 23 having a drain connected to the source of transistor 21, a gate for receiving a signal labelled "DATA", and a source connected to a power supply voltage terminal labelled "$V_{SS}$". Connected to bus line 25 is transistor 26 having a drain connected to a positive power supply voltage terminal labelled "$V_{DD}$", a gate for receiving a signal labelled "PRECHARGE", and a source connected to bus line 25. Capacitor 27 has a first electrode connected to bus line 25, and a second electrode connected to $V_{SS}$. NAND gate 28 has a first input terminal for receiving a clock signal labelled "CLOCK", a second input terminal for receiving an enable signal labelled "ENABLE", and an output terminal. Inverter 29 has an input terminal connected to the output terminal of NAND gate 28, and an output terminal which is connected to node 30 and which provides a control signal labelled "CONTROL" thereon.

In operation, circuit 20 is a driver circuit for a capacitively loaded, logic high precharged bus. Capacitor 27 represents a distributed capacitance along bus line 25, rather than a discrete capacitor. Since bus line 25 is predominantly capacitively loaded, a small distributed resistance associated with bus line 25 is omitted for ease of illustration. Transistor 26 precharges bus line 25 during a precharge period. The precharge period occurs when signal PRECHARGE is asserted as a logic high.

Since transistor 26 is an N-channel transistor connected to positive power supply voltage terminal $V_{DD}$, the voltage on bus line 25 only rises to approximately an N-channel transistor threshold voltage below $V_{DD}$. Subsequent to the precharge period, both signals CLOCK and ENABLE are asserted as a logic high, which cause signal CONTROL to be asserted and to enable circuit 20. The output terminal of NAND gate 28 is at a logic low, and the output terminal of inverter 29, node 30, is at a logic high. The voltage level on bus line 25 is then determined by signal $\overline{DATA}$.

If $\overline{DATA}$ is a logic low, then transistor 23 is nonconductive, and the voltage on the source of transistor 22 rises until the gate-to-source voltage ($V_{GS}$) of transistor 21 causes transistor 21 to no longer be conductive. The $V_{GS}$ at which transistor 21 becomes nonconductive is approximately a $V_{GS}$ threshold voltage of transistor 21. The voltage on bus line 25 remains at substantially the precharge voltage. If $\overline{DATA}$ is a logic high, however, transistor 23 becomes conductive, and the voltage on node 22 falls to approximately $V_{SS}$. The $V_{GS}$ of transistor 21 is now greater than a threshold voltage, so transistor 21 also becomes conductive. The speed of circuit 20, measured from the assertion of signal $\overline{DATA}$ as a logic high to the assertion of a logic low on bus line 25, is determined by, among other things, the relative gate sizes of transistors 21, 23, and 26.

Several features of circuit 20 limit the speed at which a logic low may be driven onto bus line 25. Firstly, in order to increase the speed at which circuit 20 switches, transistors 21 and 23 must have large gate widths. However, as the gate widths of transistors 21 and 23 increase, both the surface area of the polysilicon connected to node 30 and the capacitance thereof increase. The effect of a large capacitance on node 30 is especially deleterious if signal CONTROL enables bus drivers for a large number of data bits. Secondly, as the gate width of transistor 23 increases, the capacitance on signal $\overline{DATA}$ increases, which increases the signal propagation time and slows the circuit. Thirdly, as the gate width of transistor 21 increases, the capacitance on bus line 25 also increases.

Figure 2:
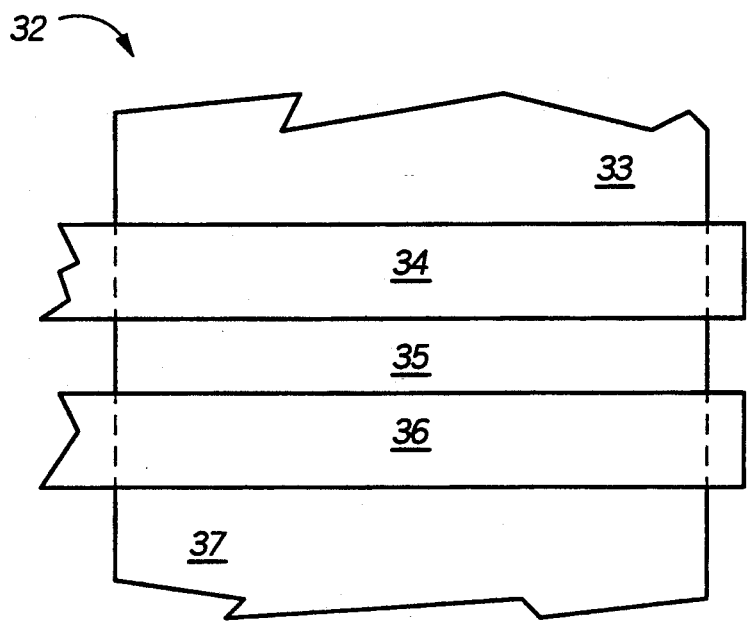
FIG. 2 illustrates a top view diagram of a portion of a data processor integrated circuit embodying two transistors of FIG. 1 in accordance with the prior art.

Fourth, circuit 20 has a charge sharing problem, due to the way transistors 21 and 23 are laid out. Transistors 21 and 23 collectively form a "two-stack" pair of transistors because the source of transistor 21 is shared with the drain of transistor 23. The common terminal is designated node 22. FIG. 2 illustrates a top view diagram of a portion 32 of an integrated circuit embodying transistors 21 and 23 of FIG. 1 in accordance with the prior art, and is laid out as a two-stack pair of transistors. Portion 32 shows a drain region 33, a polysilicon gate 34, a combined source/drain region 35, a polysilicon gate 36, and a source region 37. Drain region 33, polysilicon gate 34, and source/drain region 35 correspond to transistor 21 of FIG. 1; source/drain region 35, polysilicon gate 36, and source region 37 correspond to transistor 23 of FIG. 1. Source/drain region 35 itself corresponds to node 22 of FIG. 1. Neither a connection corresponding to the drain connection of transistor 21 to bus line 25 of FIG. 1, nor a connection corresponding to the source connection of transistor 23 to $V_{SS}$, is shown in FIG. 2. Other features of portion 32 such as oxide and other conductor layers, which are not necessary to understand the charge sharing problem, are omitted. Returning to FIG. 1, the charge sharing problem occurs when driver 20 is enabled, but $\overline{DATA}$ is a logic low. Under this condition, there is charge sharing between the bus capacitance, modeled by capacitor 27, and the capacitance on source/drain region 35 shown in FIG. 2. The ratio of the capacitance on source/drain region 35 to the capacitance of capacitor 27 is critical to the operation of circuit 20. If the capacitance of capacitor 27 is relatively small, and if the bus is precharged to an N-channel precharge level (by transistor 26) which is already less than $V_{DD}$, a transient reduction of the voltage on bus line 25 may occur because of the the charge sharing problem. If the reduction of voltage on bus line 25 is great enough, a failure occurs because an incorrect logic state is recognized on bus line 25.

Fifthly, inverter 29 must be added at the output of NAND gate 28 to provide the signal CONTROL as an active-high signal, since transistors 21 is an N-channel MOS transistor. Inverter 29 adds extra layout space. A known solution to the problems concerning the generation of signal CONTROL is to use a circuit known as a "bootstrap driver". The bootstrap driver circuit uses a charge pumping technique to increase a voltage at the gate of an N-channel pullup transistor above the positive power supply voltage. When the voltage on the gate is thus raised, the voltage on the source may rise to approximately the voltage on the drain, to provide a higher CONTROL voltage. However, in smaller device geometry processes, increasing a voltage on a transistor gate beyond a positive power supply voltage creates reliability problems in a thin oxide layer underneath a polysilicon gate. For smaller device geometries, the necessity of inverting the output of NAND gate 28 cannot be solved by using a bootstrap driver circuit.

Figure 3:
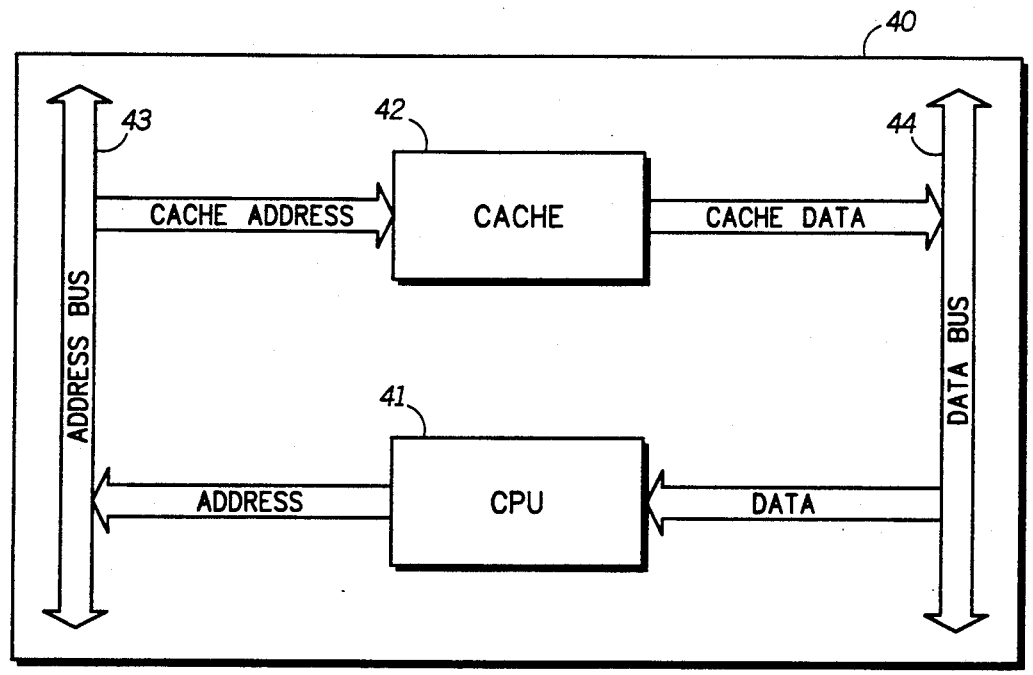
FIG. 3 illustrates in block form a data processor which uses the present invention.

FIG. 3 illustrates in block form a data processor 40 which uses the present invention. Data processor 40 comprises a CPU 41, a cache 42, an address bus 43, and a data bus 44. Other elements of data processor 40, such as control signals, blocks to couple address and data signals externally, and other functional blocks, are not shown in FIG. 3. CPU 41 is a central processing unit of data processor 40, and performs read and write accesses with memory (not shown). CPU 41 provides a plurality of address signals labelled "ADDRESS" to address bus 43, and receives a plurality of signals labelled "DATA" from data bus 44. Cache 42 is an on-chip high-speed memory provided to improve performance of data processor 40. Cache 42 receives a plurality of address signals labelled "CACHE ADDRESS" from address bus 43, and provides a plurality of signals labelled "CACHE DATA" to data bus 44.

Data bus 44 is a predominantly capacitively loaded bus which routes signals between cache 42 and CPU 41. While a data path only from cache 42 to CPU 41 is provided by data bus 44, in other embodiments other blocks may couple signals to data bus 44. Cache 42 comprises a plurality of bus driver circuits in accordance with the present invention (not shown in FIG. 3) which provide CACHE DATA to data bus 44.

Figure 4:
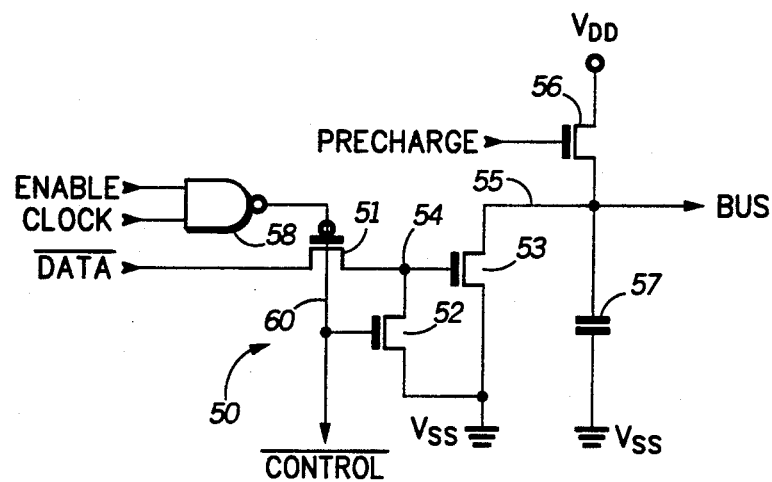
FIG. 4 illustrates in partial schematic form a CMOS bus driver circuit in accordance with the present invention.

FIG. 4 illustrates in schematic form a CMOS bus driver circuit 50 in accordance with the present invention. Also shown in FIG. 4 is a bus line 55, an N-channel transistor 56, a capacitor 57, and an inverter 58. Circuit 50 comprises a P-channel transistor 51, and N-channel transistors 52 and 53. Circuit 50 drives capacitively loaded bus line 55, which is precharged to a logic high. Transistor 51 has a source for receiving $\overline{DATA}$, a gate, and a drain connected to a node 54. Transistor 52 has a drain connected to the drain of transistor 51 at node 54, a gate connected to a node 60, and a drain connected to $V_{SS}$. Transistor 53 has a drain connected to bus line 55, a gate connected to the drain of transistor 51, and a source connected to $V_{SS}$. Transistor 56 has a drain connected to $V_{DD}$, a gate for receiving precharge signal PRECHARGE, and a source connected to bus line 55. Capacitor 57 represents a distributed capacitance along a bus line 55, and has a first electrode connected to bus line 55, and a second electrode connected to $V_{SS}$. NAND gate 58 has a first input terminal for receiving clock signal CLOCK, a second input terminal for receiving enable signal ENABLE, and an output terminal connected to node 60 for providing a signal labelled "$\overline{\text{CONTROL}}$" thereon.

In operation, circuit 50 is enabled in the same manner as circuit 20 of FIG. 1, namely by the assertion of both signals ENABLE and CLOCK. Unlike circuit 20 of FIG. 1, however, when signals ENABLE and CLOCK are asserted, active-low signal $\overline{\text{CONTROL}}$ is asserted. When circuit 50 is disabled, a logic high on $\overline{\text{CONTROL}}$ makes transistor 52 conductive, which couples the gate of transistor 53 to approximately $V_{SS}$ to keep transistor 53 nonconductive. When circuit 50 is enabled, a logic low on $\overline{\text{CONTROL}}$ makes transistor 52 nonconductive. Transistor 51 may be conductive or nonconductive, depending on the logic state of $\overline{\text{DATA}}$. If $\overline{\text{DATA}}$ is a logic low, transistor 51 remains substantially nonconductive. The voltage at the gate of transistor 53 is a logic low because any logic high voltage was previously discharged by transistor 52 when $\overline{\text{CONTROL}}$ was a logic high. If $\overline{\text{DATA}}$ is a logic high, transistor 51 is conductive, and provides a logic high on the gate of transistor 53. Transistor 53 becomes conductive, and couples bus line 55 to approximately $V_{SS}$. In the illustrated embodiment, the gate (control electrode) size of transistor 51 is substantially smaller than the gate (control electrode) size of transistor 53, and the gate (control electrode) size of transistor 52 is substantially smaller than the gate (control electrode) size of transistor 53.

Circuit 50 improves the speed of circuit 20 of FIG. 1 by eliminating, or reducing the effect of, each of the problems previously described. Firstly, the size of transistor 51 may be much smaller than the size of transistor 21 of FIG. 1 because transistor 51 is not in the conduction path between bus line 55 and $V_{SS}$. The smaller gate size of transistor 51 greatly reduces the capacitance on the $\overline{\text{CONTROL}}$ signal line, node 60. Secondly, transistors 21 and 23 of circuit 20 operate in series, but transistor 53 of circuit 50 alone discharges bus line 55. Thus the size of transistor 53 may be approximately half that of either transistor 21 or transistor 23 to obtain comparable speed, and the loading on $\overline{\text{DATA}}$ due to the capacitance of transistor 53 is approximately halved. Thirdly, since transistor 53 may be approximately half the gate size of either transistors 21 or 23, the capacitive loading on bus line 55 due to transistor 53 is approximately one-half that on bus line 25 due to transistor 21. Fourthly, the charge sharing problem which exists on node 22 between transistors 21 and 23 in FIG. 1, and as more particularly illustrated in FIG. 2, is eliminated, since circuit 50 has no nodes which bus line 25 may share capacitance with. Note also that while FIG. 4 shows N-channel transistor 56 precharging bus line 55, a different precharge scheme could be used. For example, a P-channel transistor could be used instead on transistor 56 to provide a higher precharge voltage. While precharging bus line 55 to a higher voltage would reduce the effect of the precharging problem, circuit 50 eliminates it. An additional benefit to eliminating the two-stack transistor pair is that a polysilicon gate of a single transistor may be easily laid out as a ring, with the source or drain connection inside the ring, to further reduce capacitance. Finally, transistor 51 is a P-channel transistor made conductive by a logic low, allowing the signal $\overline{\text{CONTROL}}$ to be developed from a logical NAND of signals CLOCK and ENABLE. P-channel transistor 51 eliminates the need for an extra level of inversion. Note that in some embodiments the speed of signal $\overline{\text{CONTROL}}$ is not critical, and other considerations may affect the generation of $\overline{\text{CONTROL}}$. For example, the output of NAND gate 58 could be coupled to two inverters to buffer $\overline{\text{CONTROL}}$.

It should be noted circuit 50 could be coupled to other types of signal lines instead of bus line 55. For example, circuit 50 could couple to a common signal line which is shared with one or more other circuits in a multiplexer. The common signal line differs from bus line 55 in that multiple driver circuits, which may be coupled to the common signal line, are physically close to one another. On the other hand, a typical bus line routes signals between distant parts of the integrated circuit. However, the common signal line of a multiplexer and bus line 55 share the characteristic of being predominantly capacitive loaded.

It should be apparent by now that a bus driver circuit which improves speed of providing a data signal on a predominantly capacitively-loaded bus line has been provided. The improvement results from five different sources of speed limitation, related to capacitive effects on different signal lines due to the large transistors needed in the prior art design. While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A circuit comprising:
   a data bus line;
   means for precharging said data bus line;
   means for receiving a data signal;
   a first P-channel transistor coupled to said means for receiving said data signal, having a first current electrode for receiving said data signal, a control electrode for receiving a control signal, and a second current electrode;
   a second transistor having a first current electrode coupled to said second current electrode of said first transistor, a control electrode for receiving said control signal, and a second current electrode coupled to a power supply voltage terminal; and
   a third transistor having a first current electrode coupled to said data bus line, a control electrode coupled to said second current electrode of said first transistor, and a second current electrode coupled to said power supply voltage terminal.

2. The circuit of claim 1 wherein said precharging means precharges said data bus line to one N-channel threshold voltage below a second power supply voltage terminal.

3. The circuit of claim 2 wherein said precharging means comprises a fourth N-channel transistor having a first current electrode coupled to said second power supply voltage terminal, a control electrode for receiving a precharge signal, and a second current electrode coupled to said bus line.

4. The circuit of claim 1 wherein a control electrode size of said first transistor is substantially smaller than a control electrode size of said third transistor.

5. A circuit comprising:
a data bus line;
means coupled to said data bus line for precharging said data bus line;
means for receiving a data signal;
a first P-channel transistor coupled to said means for receiving said data signal, having a first current electrode for receiving said data signal, a control electrode for receiving a control signal, and a second current electrode;
a second N-channel transistor having a first current electrode coupled to said second current electrode of said first transistor, a control electrode for receiving said control signal, and a second current electrode coupled to a power supply voltage terminal; and
a third N-channel transistor having a first current electrode coupled to said data bus line, a control electrode coupled to said second current electrode of said first transistor, and a second current electrode coupled to said power supply voltage terminal.

6. The circuit of claim 5 wherein said precharging means precharges said data bus line to one N-channel threshold voltage below a second power supply voltage terminal.

7. The circuit of claim 6 wherein said precharging means comprises a fourth N-channel transistor having a first current electrode coupled to said second power supply voltage terminal, a control electrode for receiving a precharge signal, and a second current electrode coupled to said data bus line.

8. The bus driver circuit of claim 5 wherein a control electrode size of said first transistor is substantially smaller than a control electrode size of said third transistor.

* * * * *